United States Patent [19]

Wright

[11] Patent Number: 4,694,266

[45] Date of Patent: Sep. 15, 1987

[54] NOTCH FILTER

[75] Inventor: Peter V. Wright, Dallas, Tex.

[73] Assignee: R. F. Monolithic, Inc., Dallas, Tex.

[21] Appl. No.: 891,238

[22] Filed: Jul. 29, 1986

[51] Int. Cl.[4] .......................... H03H 9/64; H03H 7/09
[52] U.S. Cl. .................... 333/196; 333/119;
    333/151; 333/176; 333/193; 333/177
[58] Field of Search ................. 333/150-155,
    333/193-196, 175-177, 131, 186, 187, 189,
    117-119; 310/313 R, 313 A, 313 B, 313 C, 313
    D; 455/303-308; 358/905; 364/821

[56] References Cited

U.S. PATENT DOCUMENTS

| 3,241,092 | 3/1966  | Toyshima         | 333/189   |
|-----------|---------|------------------|-----------|
| 3,965,446 | 6/1976  | Craven et al.    | 333/195   |
| 4,126,837 | 11/1978 | Koyamada et al.  | 333/196 X |
| 4,166,258 | 8/1979  | Tseng            | 333/195   |
| 4,327,340 | 4/1982  | Coldren          | 333/195   |
| 4,577,168 | 3/1986  | Hartmann et al.  | 333/193 X |
| 4,599,587 | 7/1986  | Hartmann et al.  | 333/196 X |

Primary Examiner—Marvin L. Nussbaum
Attorney, Agent, or Firm—Sigalos & Levine

[57] ABSTRACT

A notch filter which utilizes a quadrature coupler with the input signal on one of its four terminals, a first tuned surface acoustic wave device coupled to a second on of the terminals for receiving the input signal at 0° phase shift, a second tuned surface acoustic wave device coupled to a third one of the terminals for receiving the input signal with a 90° phase shift and the fourth terminal being utilized as the output signal terminal.

12 Claims, 5 Drawing Figures

NOTCH FILTER

BACKGROUND OF THE INVENTION

The present invention relates in general to a notch filter and in particular to an improved notch filter which has excellent rejection at the notch frequency and has low insertion loss across a very wide pass band. The notch filter utilizes a quadrature coupler with the input signal on one of its four terminals, a first tuned surface acoustic wave device coupled to a second one of the terminals for receiving the input signal at 0° degree phase shift, a second tuned surface acoustic wave device coupled to a third one of the terminals for receiving the input signal with a 90° phase shift and the fourth terminal being utilized as the output signal terminal.

A notch filter is a device which is generally presumed to pass all frequencies except for a very narrow band which is "notched out". This type of filter is also sometimes called a band elimination filter. In practice, the notch filter will have only a limited band for passing signals but typically this band width is several octaves wide. These filters are widely used to eliminate discrete frequency regions where unwanted carriers appear from adjacent channels or other sources. In addition, they are used to deny access to certain signals or alternatively to remove interference in some signals.

Typically, it is desired that a notch filter have the lowest possible insertion loss with no ripple in the pass region, and as much rejection as possible across the notch region.

Notch filters are generally implemented with inductors and capacitors and can take one of many forms. However, they are prone to temperature drift and have poor Q at UHF frequencies. The net result is that notch filters implemented using LC components tend to drift off the desired frequency and in many cases the notch width is too broad or the filter loss is too high or both. For frequencies above approximately 150 MHz, notch circuits are generally not utilized because of these problems.

Surface acoustic wave (SAW) devices inherently have much higher Q's than LC filter elements and further they generally exhibit much superior temperature stability as compared with LC elements. Thus it is desirable to implement notch filters using SAW devices particularly in the UHF band.

The difficulty in implementing a notch filter with SAW devices stems from the fact that SAW devices are of themselves band pass elements in their normal configuration in which one transducer launches a wave and a second transducer receives the wave. Thus to produce a notch characteristic, the devices must be used in conjunction with some other circuit which converts the band pass region of the SAW to a band reject region and vice versa.

One such notch filter is disclosed in U.S. Patent No. 4,577,168 in which a first circuit incorporates a single-port, single-phase, unidirectional surface acoustic wave transducer (SPUDT) as the impedance element coupled to and parallel with an inductor whose value is chosen to resonate with the static capacitance of the transducer at the center frequency of the notch. This means that this first parallel circuit is primarily reactive except at the notch frequency where the circuit is primarily resistive in nature. By placing a resistance in parallel with the first parallel circuit to form a second parallel circuit and choosing a value of the resistance substantially equal to the resistive value of the first parallel circuit at the center of the notch frequency, and by placing a phase reversal transformer in series with either the resistance or the first parallel circuit, the total circuit provides equal and opposite cancellation of signals at the notch frequency but allows all other frequencies to pass thus creating a notch filter.

This circuit functions well as a notch filter but has an inherent problem. In the prior art circuit, the SAW device is being used as a transmission element. In order to have maximum rejection of the signal frequency in the notch, the parallel inductor-impedance element circuit must become resistive and be equal in value to the resistor forming the second parallel circuit. The resistor forming the second parallel circuit must be chosen to have a value equal to $2Z_o$, where $Z_o$ is the input load, the insertion loss in the pass band is flat. This value, $2Z_o$, for the resistance causes the circuit in the notch region to be perfectly matched to the source, $Z_o$. Thus there is total absorption of the power across the notch region.

However, at frequencies in the pass band, the parallel inductor-impedance element circuit becomes essentially purely reactive or an open circuit. This means that the signal is passing only through the resistance forming the second parallel circuit. However, that resistance is now twice the value of the resistance of the input load thus creating a mismatch. Because of the mismatch there is a reflection loss and there is a dissipation loss in the resistance resulting in a net insertion loss of GdB in the filter. This insertion loss cannot be eliminated with this type of circuit because the notch filter circuit is actually the equivalent of two parallel resistors at the notch frequency and in order obtain a flat response in the pass band, they must be double the value of the input load. In the band pass region, the notch filter consists only of the resistance of the second parallel circuit, which, alone, is twice the value of the input load.

The reflections from the notch circuit in the pass band and the minimum GdB insertion loss are both undesirable.

The present invention overcomes the disadvantages of the prior art by providing a quadrature coupler which has first, second, third, and fourth terminals, a first terminal being used as a signal input terminal and a fourth terminal being used as the output terminal. The parallel inductor SAW circuit is coupled as a load to a second one of the quadrature terminals for receiving the input signal with a 0° phase shift. The load has a primarily reactive characteristic at a signal frequency higher or lower than the notch frequency band width (in the pass band) and primarily resistive characteristics across the notch region as described in the prior art. A second load is coupled to a third one of the quadrature coupler terminals for receiving the input with a 90° phase shift. This load is also primarily reactive at signal frequencies in the pass band and is primarily resistive across the notch region. When an input signal is applied to the input terminal at a frequency in the notch region, both of the loads coupled to the second and third terminals are primarily resistive and matched to the source impedance and simply absorb the load thus providing no output in creating the notch.

However, in the band pass region a different operation occurs. At the second port or terminal which is receiving the input signal with a 0° phase shift, the load, in the band pass region, is now primarily reactive. Thus the input signal is reflected. It is reflected back to the input terminal with a 0° phase shift and to the fourth or output terminal with a 90° phase shift.

The load which is coupled to the third port or terminal is also primarily reactive and thus reflects the 90° phase shifted signal back to the input terminal shifted the 90° so that it is again 0° at the input terminal. However, it is coupled directly (with 0° phase shift) to the fourth or output terminal and remains the 90° phase shifted signal thereby adding with the 90° phase shifted signal being reflected from the second terminal. Thus the input signal has been transferred to the output terminal in the band pass region with very little insertion loss and yet provides high signal rejection across the notch region thus having all the characteristics of a good notch filter.

Thus it is an object of the present invention to provide an improved notch filter for rejection of a predetermined band of signal frequencies from an input signal and a minimum of insertion loss across a wide pass band region.

It is still another objection of the present invention to provide an improved notch filter which utilizes a quadrature coupler having first and second loads coupled respectively to second and third of the terminals of the quadrature coupler which loads are formed from SAW impedance elements and which are primarily resistive at the notch frequency and primarily reactive in the band pass region thus providing an output signal on the fourth terminal with little insertion loss.

SUMMARY OF THE INVENTION

Thus the present invention relates to an improved notch filter for rejecting a predetermined band of signal frequencies from an input signal comprising a quadrature coupler having first, second, third and fourth terminals, said first terminal being a signal input terminal and said fourth terminal being a signal output terminal, a first tuned surface acoustic wave device load coupled to the second one of the terminals for receiving the input signal with 0° phase shift, the first tuned device having primarily reactive characteristics at signal frequencies higher or lower than the notch frequency band width and primarily resistive characteristics at the center of the notch frequency, and a second tuned surface acoustic wave device coupled to a third one of the terminals for receiving the input signal with a 90° phase shift, the second tuned circuit also having primarily reactive characteristics at signal frequencies higher or lower than the notch region and primarily resistive characteristics at the center of the notch region whereby no output signal is present at the fourth terminal in the notch region.

The invention also relates to an improved method of forming a notch filter for rejecting a predetermined band of signal frequencies from an input signal comprising the steps of forming a quadrature coupler having first, second, third and fourth terminals, the first terminal being a signal input terminal and the fourth terminal being a signal output terminal, coupling a first tuned surface acoustic wave device to a second one of the terminals for receiving the input signal with a 0° phase shift, the first tuned device having primarily reactive characteristics at signal frequencies higher or lower than the notch frequency band width and primarily resistive characteristics at the center of the notch frequency, and coupling a second tuned surface acoustic wave device to a third one of the terminals for receiving the input signal with a 90° phase shift, the second device having primarily reactive characteristics at signal frequencies higher or lower than the notch region and primarily resistive characteristics at the center of the notch region whereby no output signal is present at the fourth terminal at the notch region.

BRIEF DESCRIPTION OF THE DRAWINGS

These and other objects of the present invention will be disclosed in conjunction with the accompanying drawings in which.

DETAILED DESCRIPTION OF THE DRAWINGS

Figure 1:
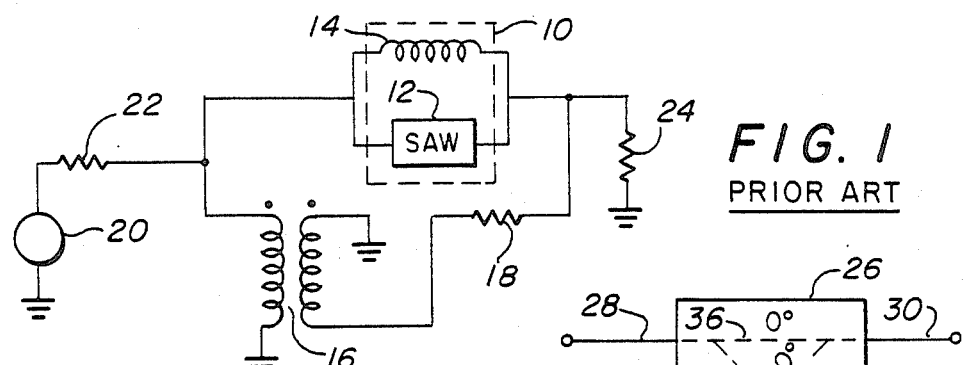
FIG. 1 is a diagramatic representation of the prior art notch filter configuration.

A schematic representation of the prior art notch filter set forth in U.S. Pat. No. 4,577,168 is illustrated in FIG. 1. The novel notch filter configuration shown in FIG. 1 comprises a first circuit 10 including the packaged, single-phase, unidirectional transducer impedance element 12 coupled as single-port device in parallel with and tuned by an inductor 14. A second circuit is in parallel with the first circuit 10 and comprises a phase reversing transformer 16 and a series connected resistor 18. A frequency source 20 applies a signal through an input load or resistor 22 to the parallel arrangement of the first and second circuits. The output load resistor 24 is coupled to the output of the first and second parallel circuits.

The wide band frequency characteristic of this parallel SAW-inductor circuit can be understood by recognizing that except for a small frequency range near resonance, the single-phase, unidirectional transducer 12 is only a finite "Q" capacitor. If the single-phase, unidirectional transducer device 12 is simply regarded as a capacitor with a finite "Q", the circuit will have all-pass characteristics.

For optimum performance, if the bridging resistor 18 is chosen to have a resistance value that is twice the resistance value of the input load resistance 22 and the output load resistance 24 (which are of nominal equal value) the transmission characteristic of the complete circuit is nominally flat at all frequencies in the pass band.

In the neighborhood of the notch frequency or region, the inductor 14 is tuned to and resonates with the static capacitance of the single-phase unidirectional transducer device 12. This resonant condition existing between the inductor 14 and the transducer device 12 causes the first or upper parallel circuit 10 to have primarily resistive characteristics in the neighborhood of the notch frequency because the inductor 14 resistance and the SAW capacitive resistance cancel. The transmission of the signal frequencies is then a balance of current flowing in the upper resonant circuit 10 and the second or lower circuit comprising the phase reversal transformer 16 and the resistor 18. If resistor 18 is chosen to be approximately equal to the equivalent resistance of the finite "Q" resonant circuit 10 at resonance, the phase reversal transformer will cause the balanced signals from the first and second parallel circuits to cancel at the output. Thus in the notch region no signal is transmitted from the input source 20 to the output load 24. At all frequencies other than in the notch region, the transmission from the signal source 20 to the output load 24 is the sum of the frequency dependent coupling through the parallel resonant circuit 10 which has variation in both magnitude and phase and the frequency independent coupling through the reversal transformer 16 and the resistor 80. If the source and load resistance 22 and 24 are chosen to have a value equal to one-half of the bridging resistor 18, the magnitude and phase of the two contributions (parallel circuit 10 and resistor 18) are such that the magnitude of the transmission is approximately flat at all frequencies other than the notch band width. In other words no signal passes through the parallel circuit 10 in the pass band because it becomes essentially a high reactance. It passes only through resistor 18 and then the transmission is essentially flat.

Assuming in the notch region that the resistance of upper parallel circuit 10 and resistor 18 are equal, the value of the parallel combination will be one-half the value of either resistance 18 or equivalent resistant circuit 10 alone. This is the case because parallel resistors, if of equal value, have an equivalent total value equal to ½ the value of either of the resistors.

Again, the resistor 18 forming the second parallel circuit must be chosen to have a value equal to twice the value of input load resistor 22 ($Z_o$) so that the insertion loss in the pass band region is flat. This value $2Z_o$, causes the circuit in the notch region to be perfectly matched to the source $Z_o$. Thus there is a total absorption of power across the notch region.

However, at frequencies in the pass band region, the parallel tuned circuit 10 becomes essentially reactive or an open circuit. The signal, therefore, passes only through the resistance 18. Resistance 18 is twice the value of input load 22 thus creating a mismatch. Because of this mismatch there is a reflection loss and there is a dissipation loss in the resistance 18 resulting in a net insertion loss of approximately GdB in the filter.

The prior art circuit of FIG. 1 functions well to provide the notch filter as disclosed in U.S. Pat. No. 4,577,168. However, it has inherent disadvantages as explained above.

The present invention allows the use of a quadrature coupler in conjunction with a SAW device to obtain a notch filter that has a low insertion loss and a wide pass band with good impedance matching across the entire range. It is also small in size and capable of handling high power.

Figure 2:
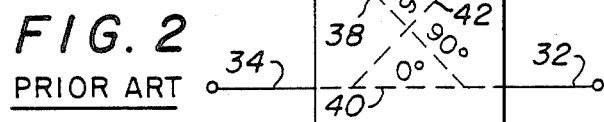
FIG. 2 is a diagramatic representation of a prior art quadrature coupler.

A transmission line quadrature couplers is old and well known in the prior art and one is illustrated schematically in FIG. 2. Quadrature coupler 26 has a first terminal 28, second and third terminals 30 and 32 and a fourth terminal 34. If an input signal is applied to terminal 28, it is transmitted directly to second terminal 30 through coupling circuit 36 with 0° phase shift. It is also coupled to third terminal 32 through coupling circuit 38 with a 90° phase shift. In like manner, if a signal is applied at second terminal 30 it will be coupled directly to first terminal 28 through coupling circuit 36 with a 0° phase shift and to fourth terminal 34 through coupling circuit 42 with a 90° phase shift. Each of the other third and fourth terminals 32 and 34 function in a similar manner.

As indicated previously, quadrature couplers are well-known in the art and can be acquired as shelf items. They vary in size and cost with the frequency they are required to handle. As the frequency decreases, the couplers become larger and more expensive. They are capable of handling extremely high frequencies and can also handle low frequencies but as indicated earlier, become large in size and have increased cost when designed to handle lower frequencies.

The coupling features of the quadrature coupler as described in relation to FIG. 2 can be utilized in a novel manner with surface acoustic wave devices to form an excellent notch filter.

Figure 3:
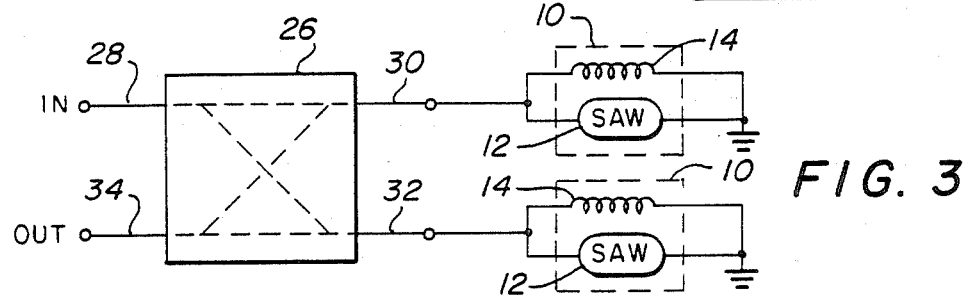
FIG. 3 is diagramatic representation of the novel notch filter configuration of the present invention and disclosed herein utilizing a quadrature coupler.

Consider now the operation of the novel circuit illustrated in FIG. 3. Consider further the operation of the circuit in the frequency range of the notch. It can be seen in FIG. 3 that a novel tuned load circuit 10, comprising SAW device 12 and inductor 14, is coupled to each of the third and fourth terminals 30 and 32 of the quadrature coupler 26. While the inductor 14 is shown in parallel in FIG. 3, other tuning such as series coupled inductors could be used. It will be recalled from the discussion earlier that in the notch region, the value of inductor 14 is adjusted to equal the static capacitance of the SAW device 12 thereby providing an essentially resistive circuit as the parallel circuit 10. The input signal on first terminal 28 will then be conducted directly to second terminal 30 with no phase shift and will see an essentially resistive load formed by parallel circuit 10 in the notch region. Thus the energy will simply be dissipated in the resistive circuit 10 only across the notch frequency region.

In like manner, the input signal on first terminal 28 will transferred to third terminal 32 with a phase shift of 90° but will also be dissipated in an essentially resistive parallel circuit 10 formed by the SAW device 12 and the tuned inductor 14 only across the notch frequency region. Thus all of the energy at the notch frequency is absorbed by the tuned circuit loads 10 coupled to second and third terminals 30 and 32.

However, the operation of the circuit is considerably different in the pass band region. Consider again an input signal applied to first terminal 28. This signal is again transmitted to second terminal 30 with no phase shift. However, at this point, because of the pass band frequency, parallel circuit 10 is essentially reactive. Thus the signal arriving at terminal 30 is reflected back from terminal 30 and is transmitted directly to input terminal 28 with 0° phase shift and to output terminal 34 with a 90° phase shift.

In like manner, the signal arriving at third terminal 32 from input terminal 28 with a 90° phase shift also sees a reactive circuit 10 because the load at that frequency is essentially reactive capacitive, and is also reflected. It is reflected back to the input terminal 28 again shifted by another 90° or it arrives back at terminal 28 with a 180° phase shift with respect to the signal reflected from second terminal 30 and they are canceled. However, it is transmitted also directly to output terminal 34 with a 0° phase shift and since it has already been shifted 90°, that original 90° phase shift now appears at output terminal 34 and adds to the 90° phase shifted signal from second terminal 30. Thus the entire input signal is now present at output terminal 34.

Thus the circuit shown in FIG. 3 utilizes the reflective properties of surface acoustic wave devices. Such devices can handle large amounts of power in reflection but not so much power in transmission such as when utilized in the prior art circuit of FIG. 1. In addition, the circuit in FIG. 3 is perfectly matched at all frequencies within the design range of the quadrature coupler. Also, no power is dissipated in each parallel circuit 10 in the pass band region because they are essentially reactive circuits. They, the loads 10, dissipate power only in the notch region because they become essentially resistive circuits. Thus in the circuits shown in FIG. 3 the insertion loss is very small and in an actual circuit constructed as shown in FIG. 3 the insertion loss was only 1.5 dB. Further, the circuit shown in FIG. 3 becomes a very broad band circuit and is essentially flat in the pass band region.

Figure 5:
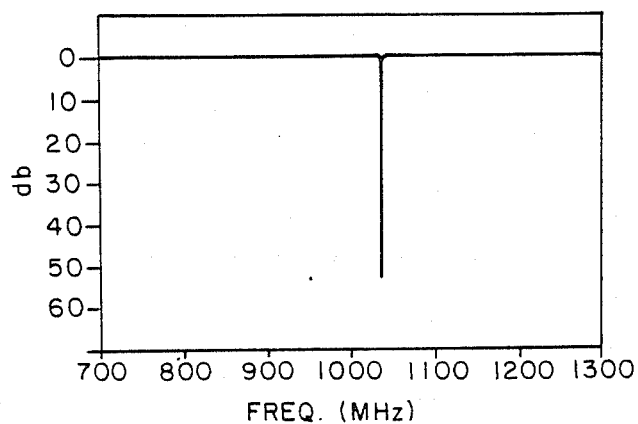
FIG. 5 is a graph illustrating the frequency response of the novel notch filter over a very broad frequency range.

FIG. 5 illustrates the frequency response of the novel notch filter over a very broad frequency range and magnitude. As can be seen in FIG. 5 the circuit has approximately 1.5 dB insertion loss and is essentially flat in the band pass region.

As indicated earlier, the circuit in FIG. 3 works well over a large frequency range as for example from 700 megahertz to 1300 megahertz as shown in FIG. 5. However, also as indicated earlier, as the frequency at which the circuit operates becomes lower, the quadrature hybrid coupler becomes larger in size and has a greatly increased cost.

Figure 4:
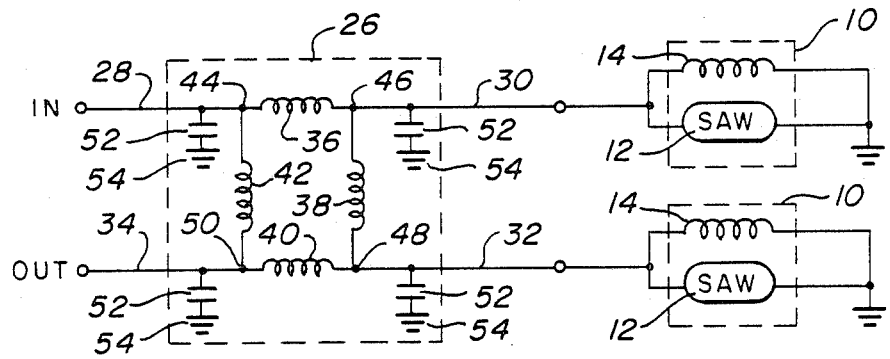
FIG. 4 is a diagramatic representation of the novel notch filter of the present invention utilizing inductor capacitor components to form a quadrature coupler.

This problem can be overcome by using the low frequency lumped element quadrature hybrid 26 shown in FIG. 4 which essentially replaces the quadrature coupler 26 in FIG. 3. In this case, first, second, third and fourth inductors 36, 38, 40 and 42, respectively, are serially connected to form a continuous circuit. Terminal 28 is coupled to the junction 44 of inductors 36 and 42. Terminal 30 is coupled to junction 46 of inductors 36 and 38. Terminal 32 is coupled to junction 48 of inductor 38 and 40 and terminal 34 is coupled to junction 50 of inductors 40 and 42. In addition, a capacitance 52 is coupled between each of the terminals 28, 30, 32 and 34 and ground potential 54. The quadrature coupler 26 in FIG. 4. operates in the same manner as the quadrature coupler in 26. That is, a signal applied to terminal 28 will be coupled to terminal 30 with 0° phase shift and to terminal 32 with 90° phase shift. Each of the other terminals 30, 32 and 34 operate in similar manner. The difference with the circuit in FIG. 4 as compared to the transmission line quadrature hybrid circuit in FIG. 3 is that it does not function over as wide a band width as the transmission line quadrature coupler of FIG. 3. For instance the circuit in FIG. 4 will function to a frequency of approximately 800 megahertz at which time the parasitics become noticeable and the performance is degraded. However, the circuits in FIG. 3 and FIG. 4 overlap between approximately 500 megahertz and 800 megahertz and the use of one over the other will depend on the size of the devices, cost, performance and the like. In general the circuit of FIG. 4 operates identical to the circuit of FIG. 3 except in a lower frequency range.

Thus there has been disclosed a novel notch filter which utilizes a quadrature coupler having an input on one terminal and a first load consisting of a parallel tuned circuit formed of an inductor and a SAW device coupled to the 0° phase shift terminal and a second, like tuned load, coupled to the 90° phase shift terminal. Each of these parallel tuned loads is primarily resistive in the notch region and primarily reactive in the band pass region thereby allowing the signals to be absorbed by the resistive features of the parallel tuned circuits in the notch region but reflecting the band pass frequencies to the output terminal in an adding relationship so that a notch circuit is obtained which has very little insertion loss, a wide pass band and a good impedance match across the entire range of frequencies. They are also small in size and can handle signals of high power since they reflect those signals in the pass band.

While the invention has been described in connection with a preferred embodiment, it is not intended to limit the scope of the invention to the particular form set forth but, on the contrary, it is intended to cover such alternatives, modifications, and equivalents as may be included within the spirit and scope of the invention as defined by the appended claims.

I claim:

1. An improved notch filter for rejecting a predetermined band of signal frequencies from an input signal comprising:
   a. a quadrature coupler having first, second, third, and fourth terminals, said first terminal being a signal input terminal and said fourth terminal being an output terminal,
   b. a first tuned surface acoustic wave device coupled to said second one of said terminals for receiving said input signal with 0° phase shift, said first tuned device having primarily reactive characteristics at signal frequencies higher or lower than the notch region and primarily resistive characteristics across said notch region, and
   c. a second tuned surface acoustic wave device coupled to a third one of said terminals for receiving said input signal with a 90° phase shift, said second tuned device having primarily reactive characteristics at signal frequencies higher or lower than the notch region and primarily resistive characteristics across said notch region, such that no output signal is present on said fourth terminal across said notch region but is present in the band pass region.

2. A notch filter as in claim 1 wherein said tuned surface acoustic wave device coupled to said second and third terminals comprises:
   a. a surface acoustic wave impedance element having an input admittance substantially constant in both magnitude and phase over a predetermined band width across said notch region, and
   b. an inductor tuning said impedance element to form a circuit primarily resistive across said notch region and primarily reactive across said pass band region.

3. An improved notch filter as in claim 2 wherein said impedance element is a single-port, single-phase, surface acoustic wave resonator.

4. A notch filter as in claim 2 wherein said impedance element is a surface acoustic wave resonator.

5. An improved notch filter as in claim 3 wherein:
   a. said single-phase surface acoustic wave device has a inherent static capacitance, and
   b. said inductor value is chosen to exactly resonate with said static capacitance at the center of said notch region thereby forming an essentially resistive circuit at said notch frequency.

6. An improved notch filter as in claim 4 wherein said quadrature coupler comprises:

a. first, second, third and fourth inductors serially connected to form a continuous circuit,
b. means for coupling a respective one of said first, second, third and fourth terminals to each junction between each two serially connected inductors,
c. a ground potential, and
d. a capacitance coupled between each of said terminals and said ground potential.

7. A method of forming an improved notch filter for rejecting a predetermined band of signal frequencies from an input signal comprising the steps of:
   a. forming a quadrature coupler having first, second, third and fourth terminals, said first terminal being a signal input terminal and said fourth terminal being an output terminal,
   b. coupling a first tuned surface acoustic wave device to said second one of said terminals for receiving said input signal with a 0° degree phase shift, said first tuned device having primarily reactive characteristics at said signal frequencies higher or lower than the notch region and primarily resistive characteristics across said notch region, and
   c. coupling a second tuned surface acoustic wave device to a third one of said terminals for receiving said input signal with a 90° phase shift, said second tuned device having primarily reactive characteristics at signal frequencies higher or lower than the notch region and primarily resistive characteristics across said notch region such that no output signal is present on said fourth terminal across said notch region but is present in the band pass region.

8. The method as in claim 7 wherein the step of coupling said tuned surface acoustic wave device to said second and third terminals further comprises the steps of:
   a. forming a surface acoustic wave impedance element having an input admittance substantially constant in both magnitude and phase over a predetermined band width across said notch region, and
   b. tuning said impedance element with an inductor to form a circuit that is primarily resistive across said notch region and primarily reactive across and pass band region.

9. A method as in claim 8 further comprising the step of forming said impedance element of a single port, single-phase surface acoustic wave device.

10. A method as in claim 9 further comprising the step of forming said impedance element of a surface acoustic wave resonator.

11. The method of claim 9 further comprising the steps of:
   a. forming said single phase surface acoustic wave device with an inherent static capacitance and
   b. choosing said inductor value to exactly resonate with said static capacitance at the center of said notch thereby forming an essentially resistive circuit.

12. The method of claim 11 wherein the said step of forming said quadrature coupler further comprises the steps of:
   a. serially connecting first, second, third and fourth inductors to form a continuous circuit,
   b. coupling a respective one of said first, second, third and fourth terminals to each junction between each two of said serially connected inductors, and
   c. coupling a capacitance between each of said terminals and ground potential.

* * * * *